(12) United States Patent
Jeong et al.

(10) Patent No.: US 9,508,949 B2
(45) Date of Patent: Nov. 29, 2016

(54) ORGANIC LIGHT-EMITTING DEVICE

(71) Applicant: LG DISPLAY CO., LTD., Seoul (KR)

(72) Inventors: Wonik Jeong, Daejeon (KR); Jeamin Moon, Daejeon (KR); Yun Hye Hahm, Daejeon (KR); Jina You, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/415,069

(22) PCT Filed: Jul. 18, 2013

(86) PCT No.: PCT/KR2013/006438
§ 371 (c)(1),
(2) Date: Jan. 15, 2015

(87) PCT Pub. No.: WO2014/014288
PCT Pub. Date: Jan. 23, 2014

(65) Prior Publication Data
US 2015/0194624 A1    Jul. 9, 2015

(30) Foreign Application Priority Data
Jul. 18, 2012 (KR) .................. 10-2012-0078453

(51) Int. Cl.
*H01L 51/52* (2006.01)
*H01L 51/54* (2006.01)
*H01L 51/50* (2006.01)
H01L 27/32 (2006.01)
H01L 51/00 (2006.01)

(52) U.S. Cl.
CPC ......... *H01L 51/5064* (2013.01); *H01L 51/508* (2013.01); *H01L 51/5008* (2013.01); *H01L 51/5056* (2013.01); *H01L 51/5072* (2013.01); H01L 27/32 (2013.01); H01L 51/0032 (2013.01); H01L 51/0059 (2013.01); H01L 51/0067 (2013.01); H01L 51/0072 (2013.01); H01L 51/0097 (2013.01); H01L 51/5004 (2013.01); H01L 51/5096 (2013.01); H01L 51/5284 (2013.01); H01L 2251/552 (2013.01)

(58) Field of Classification Search
None
See application file for complete search history.

(56) References Cited

U.S. PATENT DOCUMENTS

| 5,955,836 A | 9/1999 | Boerner et al. |
| 2004/0061136 A1 | 4/2004 | Tyan et al. |
| 2005/0221121 A1 | 10/2005 | Ishihara et al. |

(Continued)

FOREIGN PATENT DOCUMENTS

| CN | 1498046 A | 5/2004 |
| CN | 102024908 A | 4/2011 |

(Continued)

OTHER PUBLICATIONS

Kenchi Goushi, et al.: "Organic light-emitting diodes employing efficient reverse intersystem crossing for triplet-to-singlet state conversion", XP055133808, Nature Photonics, vol. 6, No. 4, Mar. 11, 2012, pp. 253-258.

(Continued)

*Primary Examiner* — Hoang-Quan Ho
(74) *Attorney, Agent, or Firm* — Dentons US LLP

(57) ABSTRACT

An organic light emitting device includes a first electrode, a second electrode, and two or more organic material layers provided between the first electrode and the second electrode. The organic material layer includes a light emitting layer, and a mixed layer including one or more hole transfer materials and one or more electron transfer materials.

19 Claims, 4 Drawing Sheets

(56) References Cited

U.S. PATENT DOCUMENTS

| | | | |
|---|---|---|---|
| 2007/0024188 A1* | 2/2007 | Kim et al. | 313/504 |
| 2007/0172700 A1* | 7/2007 | Nishita | 428/690 |
| 2007/0222370 A1* | 9/2007 | Zhu et al. | 313/504 |
| 2008/0012471 A1 | 1/2008 | Cok | |
| 2009/0321725 A1* | 12/2009 | Yoshida et al. | 257/40 |
| 2011/0068331 A1 | 3/2011 | Koh et al. | |
| 2011/0073897 A1 | 3/2011 | Kang et al. | |
| 2011/0210323 A1 | 9/2011 | Imai | |
| 2012/0187827 A1* | 7/2012 | Hunze et al. | 313/506 |

FOREIGN PATENT DOCUMENTS

| | | |
|---|---|---|
| CN | 102037580 A | 4/2011 |
| JP | 2005-285708 A | 10/2005 |
| JP | 2007-200938 | 8/2007 |
| JP | 2008-130687 | 6/2008 |
| KR | 2010-0045326 | 5/2010 |
| KR | 2011-0032589 | 3/2011 |

OTHER PUBLICATIONS

Yu-Sheng Tsai, et al.: "Improve the Charge Balance of White Phosphorescent Organic Light Emitting Diodes using co-doped electron transport layer in Emitting Layer", XP055197676, Advanced Materials Research, vol. 287-290, Jul. 4, 2011, pp. 3051-3055.

* cited by examiner

Fig. 1

| 601 |
|---|
| 501 |
| 401 |
| 301 |
| 201 |
| 101 |

Fig. 2

| 601 |
|---|
| 501 |
| 301 |
| 401 |
| 201 |
| 101 |

ORGANIC LIGHT-EMITTING DEVICE

TECHNICAL FIELD

This application is a 35 USC §371 National Stage entry of International Application No. PCT/KR2013/006438, filed on Jul. 18, 2013, which claims priority to and the benefits of Korean Patent Application No. 10-2012-0078453, filed with the Korean Intellectual Property Office on Jul. 18, 2012, the entire contents of which are incorporated herein by reference.

The present specification relates to an organic light emitting device.

BACKGROUND ART

An organic light emission phenomenon is an example of the conversion of current into visible light by the internal process of a specific organic molecule. The principle of the organic light emission phenomenon is as follows. When an organic material layer is placed between an anode and a cathode, if voltage is applied to the specific organic molecule through two electrodes, electrons and holes from the cathode and the anode, respectively, flow into the organic material layer. The electrons and the holes injected into the organic material layer are recombined to form excitons, and these excitons fall back to the ground state and emit light. An organic light emitting device using this principle may include, generally, a cathode, an anode, and an organic material layer placed therebetween, for example, an organic material layer that includes a hole injection layer, a hole transfer layer, a light emitting layer and an electron transfer layer.

DISCLOSURE

Technical Problem

The present specification describes an organic light emitting device having a novel structure.

Technical Solution

The present specification provides an organic light emitting device that includes a first electrode; a second electrode; and two or more organic material layers provided between the first electrode and the second electrode, wherein the organic material layer includes a light emitting layer; and a mixed layer including one or more hole transfer materials and one or more electron transfer materials.

In addition, the present specification provides a display that includes the organic light emitting device.

Furthermore, the present specification provides an illumination device that includes the organic light emitting device.

Advantageous Effects

The organic light emitting device of the present specification has an advantage in that the driving voltage is low.

Furthermore, the organic light emitting device of the present specification has an advantage in that the power efficiency is excellent.

In addition, the organic light emitting device of the present specification has an advantage in that the quantum efficiency (Q.E.) is excellent.

DESCRIPTION OF DRAWINGS

FIG. 1 and FIG. 2 are diagrams showing an organic light emitting device according to one embodiment of the present specification.

MODE FOR SPECIFICATION

Figure 3:
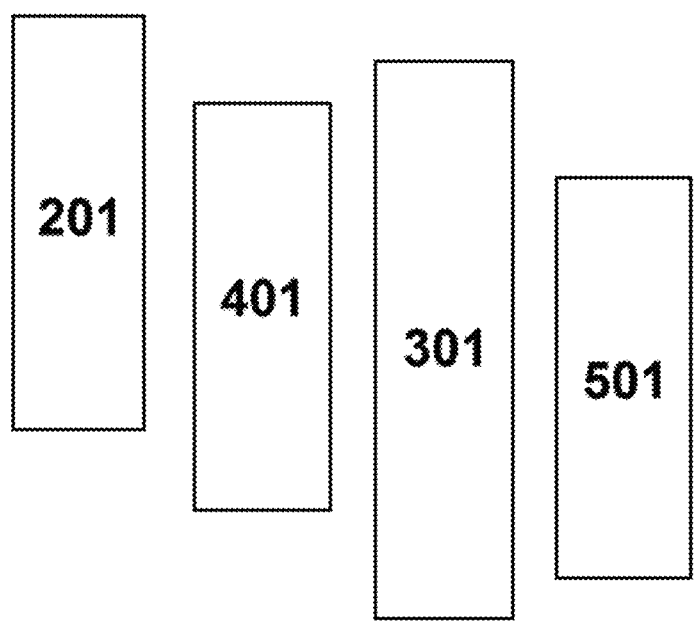
FIG. 3 is a diagram showing the energy level difference of each layer in an organic light emitting device according to one example of the present specification.

Hereinafter, embodiments illustrated in the present specification will be described in detail.

The present specification provides an organic light emitting device that includes a first electrode; a second electrode; and two or more organic material layers provided between the first electrode and the second electrode, wherein the organic material layer includes a light emitting layer; and a mixed layer including one or more hole transfer materials and one or more electron transfer materials.

According to one embodiment of the present specification, the mixed layer may be adjoined to the light emitting layer.

Being adjoined to the light emitting layer may mean that the mixed layer is provided in the state of being physically attached to the light emitting layer. It may also mean that the mixed layer is provided closer to the light emitting layer than any other layers mentioned in the present specification.

According to one embodiment of the present specification, the mixed layer can increase the efficiency of the organic light emitting device by reusing the triplet excitons generated in the light emitting layer, and using a charge transfer complex generated within the mixed layer. Therefore, it is preferable that the mixed layer is adjacent to the light emitting layer of an organic light emitting device.

According to one embodiment of the present specification, the site of light emission of the organic light emitting device is widely distributed in a Gaussian form, and a recombination zone can be distributed even to part of the mixed layer adjacent to the light emitting layer. In this case, even triplet excitons, which have remained unused in the light emitting layer can be utilized, since the spin state of excitons can be changed in the charge transfer complex of the hole transfer material and the electron transfer material within the mixed layer. In addition, when the triplet excitons generated within the light emitting layer are transferred to the adjacent mixed layer, whereby energy transfer to the charge transfer complex occurs, even triplet excitons, which have remained unused in the light emitting layer, can similarly be utilized, by changing the spin state of excitons.

According to one embodiment of the present specification, the materials included in the light emitting layer can be determined depending on the energy level of the charge transfer complex generated in the mixed layer. Specifically, according to one embodiment of the present specification, when the energy of the charge transfer complex of the mixed layer is 2.5 eV, the energy of the light emitting material included in the light emitting layer can be greater than 2.5 eV. More specifically, according to one embodiment of the present specification, when the light emitting layer includes a blue-light emitting material, the energy of the charge transfer complex of the mixed layer can be 2.7 eV or more.

The energy of the charge transfer complex may mean the energy level of the charge transfer complex, and the energy of the light emitting material may be the energy level when the light emitting material is in a singlet state.

According to one embodiment of the present specification, the organic material layer may further include a hole transfer layer, and the mixed layer may be provided between the hole transfer layer and the light emitting layer. Specifically, when the electron mobility of the light emitting layer is greater than the hole mobility of the light emitting layer, a recombination zone is more likely to be present at the interface between the light emitting layer and the hole transfer layer, therefore, triplet excitons of the light emitting layer can be reused by providing the mixed layer between the light emitting layer and the hole transfer layer.

In FIG. 1, an organic light emitting device according to one embodiment of the present specification is shown by the diagram. Specifically, an organic light emitting device in which a hole transfer layer (201), a mixed layer (301), a light emitting layer (401), an electron transfer layer (501) and a cathode (601) are layered in consecutive order on an anode (101) is shown by the diagram. However, the organic light emitting device of the present specification is not limited to the above configuration, and additional layers can be further included.

Furthermore, according to one embodiment of the present specification, the organic material layer may further include an electron transfer layer, and the mixed layer may be provided between the electron transfer layer and the light emitting layer. Specifically, when the hole mobility of the light emitting layer is greater than the electron mobility of the light emitting layer, a recombination zone is more likely to be present at the interface between the light emitting layer and the electron transfer layer, therefore, triplet excitons of the light emitting layer can be reused by providing the mixed layer between the light emitting layer and the electron transfer layer.

In FIG. 2, an organic light emitting device according to one embodiment of the present specification is shown by the diagram. Specifically, an organic light emitting device in which a hole transfer layer (201), a mixed layer (301), a light emitting layer (401), an electron transfer layer (501) and a cathode (601) are layered in consecutive order on an anode (101) is shown by the diagram. However, the organic light emitting device of the present specification is not limited to the above configuration, and additional layers can be further included.

According to one embodiment of the present specification, the mixed layer may be a layer that includes one, or two or more, of each of hole transfer materials and electron transfer materials.

According to one embodiment of the present specification, the mixed layer may be a layer in which a hole transfer material and an electron transfer material are mixed. Specifically, the mixed layer may form a single layer without the hole transfer material and the electron transfer material being combined with each other.

According to one embodiment of the present specification, the mixed layer may include a charge transfer complex of a hole transfer material and an electron transfer material. Specifically, according to one embodiment of the present specification, the mixed layer may be formed from the combination of the hole transfer material and the electron transfer material, which form a charge transfer complex. Furthermore, according to one embodiment of the present specification, the mixed layer may further include the charge transfer complex; a hole transfer material remaining without forming a charge transfer complex; and an electron transfer material.

According to one embodiment of the present specification, when the hole transfer material and the electron transfer material are mixed, the charge transfer complex may be formed from the two materials.

According to one embodiment of the present specification, in order to form the charge transfer complex by mixing a hole transfer material and an electron transfer material, a complex needs to be formed from the two materials as electrons in an excited state are transferred from the hole transfer material, which has electron-donating properties, to the electron transfer material, which has electron-accepting properties. As a result, according to one embodiment of the present specification, the hole transfer material of the mixed layer may have strong electron-donating properties, and the electron transfer material may have strong electron-accepting properties.

In addition, according to one embodiment of the present specification, since the hole transfer material and the electron transfer material of the mixed layer are combined together, charge transfer occurs between the two, and the two materials can be in a bound state due to electrostatic attraction therebetween.

The charge transfer complex of the present specification may mean a state in which electrons and holes are distributed in two different materials.

According to one embodiment of the present specification, in the charge transfer complex of the mixed layer, a new energy level that is generated by the charge transfer complex is produced in addition to the energy level of the hole transfer material and the electron transfer material, which form a charge transfer complex.

Specifically, due to the binding properties of electrons and holes, the distance between electrons and holes is greater in the charge transfer complex than in the exciton state formed in each of the hole transfer material and the electron transfer material. In other words, electrons and holes in the exciton state of the charge transfer complex are more weakly bound than electrons and holes in the exciton state generated within each of the hole transfer material and the electron transfer material.

As a result, the charge transfer complex lowers the exchange energy between electrons and holes, and thereby reduces the difference between a singlet energy level and a triplet energy level. Eventually, when the charge transfer complex is formed by the combination of the hole transfer material and the electron transfer material, materials having a small difference between singlet energy and triplet energy can be produced. Specifically, according to one embodiment of the present specification, the charge transfer complex can make the difference between the singlet energy level and the triplet energy level small. According to one embodiment of the present specification, the difference between the singlet energy and the triplet energy can be 0.3 eV or less.

The inventors found that the biggest factor reducing efficiency in an organic light emitting device using fluorescence utilizing only singlet excitons is triplet excitons generated by electron-hole recombination. In this case, singlet excitons generated by the recombination accounted for only approximately 25%.

As a result, the inventors have developed an organic light emitting device that includes the mixed layer of the present specification. That is, the organic light emitting device according to one embodiment of the present specification can solve the problems described above, and can achieve greater efficiency. Specifically, by using materials having a small difference between singlet energy and triplet energy, such as the charge transfer complex, efficiency can be improved, since triplet excitons, which used to be unused in an organic light emitting device using fluorescence, can be utilized.

Specifically, in the organic light emitting device according to one embodiment of the present specification, an efficiency improvement is achieved by forming a charge transfer complex through the combination of an electron transfer material and a hole transfer material, and enabling the reuse of unused triplet excitons among the excitons generated through the recombination of electrons and holes in a light emitting layer using the small singlet-triplet energy difference of the charge transfer complex.

In the light emitting layer of the organic light emitting device according to one embodiment of the present specification, the recombination method of electrons and holes can be divided into two main methods.

First, according to one embodiment of the present specification, after excitons are formed by the recombination of electrons and holes in a host material within the light emitting layer, light emission can occur through energy transfer to a dopant material. Specifically, when the light emitting layer is constituted with a host-guest system, excitons are first formed in a host material by Langevin-type recombination, in which holes and electrons are injected to the HOMO energy level and the LUMO energy level of the host material, respectively, after which excitons are consecutively formed in a dopant material through energy transfer, and eventually, light emission can occur in the dopant material. According to one embodiment of the present specification, light emission such as that described above may occur in an organic light emitting device that includes a fluorescent light emitting layer.

Second, according to one embodiment of the present specification, light emission can occur due to the direct formation of excitons in a dopant material upon the direct injection of electrons and holes into the dopant material. Specifically, light emission can occur in a manner similar to Shockley-Read-Hall type (SRH type) emission. According to one embodiment of the present specification, light emission such as the above may occur in an organic light emitting device that includes a phosphorescent light emitting layer.

According to one embodiment of the present specification, when the light emitting layer is composed of a combination of a host material and a dopant material, the host material may play the role of passing over excitons without participating in actual light emission. Therefore, the host material needs to have a higher energy than the dopant material. As a result, according to one embodiment of the present specification, a host material that releases energy in a range overlapping the energy absorption range of a dopant material may be used for more efficient energy transfer.

According to one embodiment of the present specification, the recombination of electrons and holes within a light emitting layer occurs as Langevin-type recombination, and when light emission occurs through energy transfer from a host material to a dopant material, excitons of the host material generated by the recombination of initial electrons and holes may have higher energy than the energy of the dopant in which light emission occurs. At this time, the energy level of triplet excitons as well as the energy level of singlet excitons of the host material may be higher than the energy level of the dopant material.

Furthermore, according to one embodiment of the present specification, in the organic light emitting device that includes a fluorescent light emitting layer, the excitons used in light emission are singlet excitons of a host material, and triplet excitons of the host material may not contribute to light emission. Triplet excitons of the host material have a long lifespan, and they may generate singlet excitons by triplet-triplet annihilation while being diffused within the light emitting layer, and thus may be reused for light emission. In addition, triplet excitons of the host material may be annihilated while dissipating heat depending on their vibronic level, and may be annihilated after transferring energy to triplets of the dopant material. In other words, triplet excitons of a host material are problematic in that they do not contribute to light emission.

Triplet excitons of the host material can be diffused to an adjacent layer. Therefore, according to one embodiment of the present specification, the efficiency of an organic light emitting device can be improved by reusing the triplet excitons of a host material diffused to a mixed layer provided adjacent to a light emitting layer. Specifically, a charge transfer complex within the mixed layer can turn the unused triplet excitons in the light emitting layer into singlet excitons, and light emission efficiency can be improved by transferring the singlet excitons generated at that time to the light emitting layer. In addition, according to one embodiment of the present specification, when the light emitting layer of the organic light emitting device is a fluorescent light emitting layer, the increase in light emission efficiency can be superior.

According to one embodiment of the present specification, the energy level of triplet excitons of the host material may be the same as or greater than the singlet energy level of the dopant, the same as or greater than the energy level of the charge transfer complex within the mixed layer, and smaller than the energy level of triplet excitons of the hole transfer material and the electron transfer material within the mixed layer.

According to one embodiment of the present specification, the mass ratio of the hole transfer material and the electron transfer material of the mixed layer may range from 1:4 to 4:1.

Specifically, when the mixed layer is formed using the hole transfer material and the electron transfer material within the above range, the use of triplet excitons generated in the light emitting layer can be maximized. Furthermore, when the charge transfer complex is formed within the above range, the formation of the charge transfer complex can be maximized, and therefore, the efficiency of the organic light emitting device can be improved.

According to one embodiment of the present specification, the mixed layer can transfer both electrons and holes, since the mixed layer includes the hole transfer material, the electron transfer material, and the charge transfer complex thereof. In addition, the mobility of electrons and holes can be adjusted by adjusting the mixing ratio of the hole transfer material and the electron transfer material. In other words, the charge balance can be adjusted within the light emitting layer by adjusting the mobility of electrons and holes.

Furthermore, according to one embodiment of the present specification, the density of state (DOS) of the mixed layer may also be more widely distributed compared with the DOS when the hole transfer material and the electron transfer material are separately present. In other words, the energy level in which holes or electrons can be transferred may also have the energy level of each of the hole transfer material and the electron transfer material, and may have the DOS of each of the hole transfer material and the electron transfer material.

In addition, according to one embodiment of the present specification, energy transfer can occur between the hole transfer material and the electron transfer material within the mixed layer, and energy transfer between the hole transfer material and/or the electron transfer material and the charge transfer complex can also occur.

In FIG. 3, the energy level of each layer in an organic light emitting device according to one example of the present specification is shown by the diagram. Specifically, for the energy level of a mixed layer (301), the energy distribution can be wide, as seen in FIG. 3, since the hole transfer material and the electron transfer material are mixed.

According to one embodiment of the present specification, when the hole transfer material and the electron transfer material of the mixed layer form a charge transfer complex, the maximum energy that the charge transfer complex may have can be the difference between the HOMO energy level of the hole transfer material and the LUMO energy level of the electron transfer material. In this case, electrons and holes can be in a state of being weakly bound to each other while the electrons are present in the LUMO of the electron transfer material, and the holes are present in the HOMO of the hole transfer material. As a result, the band gap of the charge transfer complex becomes smaller than the band gap of the single hole transfer material or the single electron transfer material, which form the charge transfer complex. In addition, electrons and holes of the charge transfer complex are stabilized by binding to each other due to coulombic attraction, by which the band gap of the charge transfer complex may become smaller than the difference between the HOMO energy level of the hole transfer material and the LUMO energy level of the electron transfer material.

Figure 4:
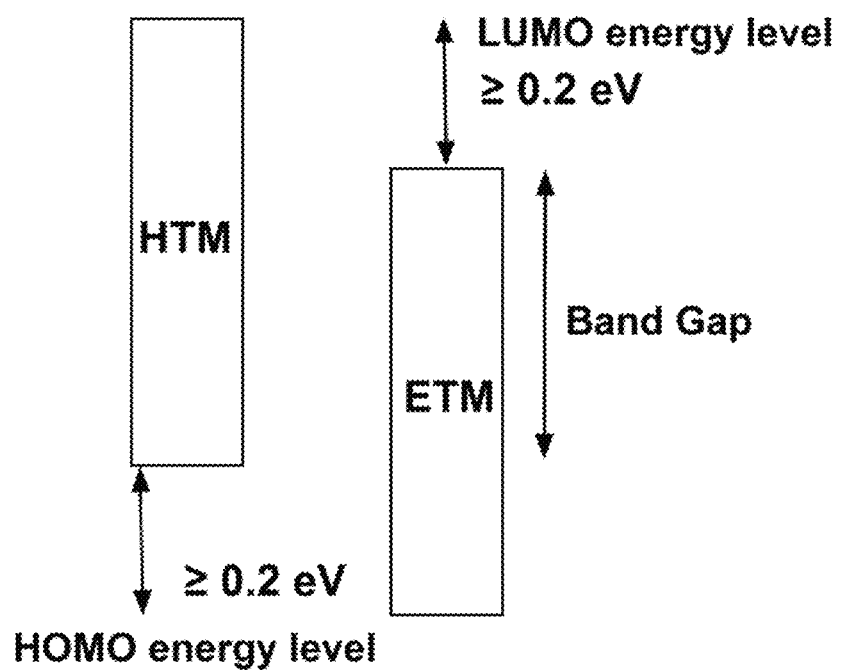
FIG. 4 is a diagram showing one example of the band gap of a charge transfer complex included in the mixed layer of an organic light emitting device according to one example of the present specification, and the energy level difference between a hole transfer material (HTM) and an electron transfer material (ETM) that form the charge transfer complex.

In FIG. 4, one example of the band gap of a charge transfer complex within the mixed layer and the energy level difference between a hole transfer material and an electron transfer material, which form the charge transfer complex, are shown by the diagram.

According to one embodiment of the present specification, when the charge transfer complex is formed, the binding energy of holes of a hole transfer material and electrons of an electron transfer material may be 0.2 eV or less.

According to one embodiment of the present specification, the HOMO energy level difference between the hole transfer material and the electron transfer material of the mixed layer may be 0.2 eV or more. Specifically, the HOMO energy level difference may be 0.3 eV or more.

In addition, according to one embodiment of the present specification, the LUMO energy level difference between the hole transfer material and the electron transfer material of the mixed layer may be 0.2 eV or more. Specifically, the LUMO energy level difference may be 0.3 eV or more.

Furthermore, according to one embodiment of the present specification, the HOMO energy level difference between the hole transfer material and the electron transfer material of the mixed layer may be 0.2 eV or more, and the LUMO energy level difference may be 0.2 eV or more. Specifically, the HOMO energy level difference may be 0.3 eV or more, and the LUMO energy level difference may be 0.3 eV or more.

According to one embodiment of the present specification, the difference between the HOMO energy level of the hole transfer material and the LUMO energy level of the electron transfer material of the mixed layer may be 2 eV or more. Specifically, the difference between the HOMO energy level of the hole transfer material and the LUMO energy level of the electron transfer material of the mixed layer may be 2.6 eV or more.

According to one embodiment of the present specification, the ionization potential difference between the hole transfer material and the electron transfer material of the mixed layer may be 0.2 eV or more. Specifically, the ionization potential difference between the hole transfer material and the electron transfer material of the mixed layer may be 0.3 eV or more. In addition, according to one embodiment of the present specification, the electron affinity difference between the hole transfer material and the electron transfer material of the mixed layer may be 0.2 eV or more. Specifically, the electron affinity difference between the hole transfer material and the electron transfer material of the mixed layer may be 0.3 eV or more.

Furthermore, according to one embodiment of the present specification, the ionization potential difference between the hole transfer material and the electron transfer material of the mixed layer may be 0.2 eV or more, and the electron affinity difference between the hole transfer material and the electron transfer material of the mixed layer may be 0.2 eV or more. Specifically, the ionization potential difference between the hole transfer material and the electron transfer material of the mixed layer may be 0.3 eV or more, and the electron affinity difference between the hole transfer material and the electron transfer material of the mixed layer may be 0.3 eV or more.

According to one embodiment of the present specification, the difference between the electron affinity of an electron transfer material and the ionization potential of the hole transfer material of the mixed layer may be 2 eV or more. Specifically, the difference between the electron affinity of an electron transfer material and the ionization potential of the hole transfer material of the mixed layer may be 2.6 eV or more.

According to one embodiment of the present specification, when the HOMO energy level difference and the LUMO energy level difference between the hole transfer material and the electron transfer material of the mixed layer and the difference between the LUMO energy level of an electron transfer material and the HOMO energy level of a hole transfer material are within the above range, the binding energy of excitons within the mixed layer may be greater than the binding energy of excitons of a hole transfer material or an electron transfer material. In other words, the hole transfer material and the electron transfer material may smoothly form a charge transfer complex.

Furthermore, according to one embodiment of the present specification, when the ionization potential difference and the electron affinity difference between the hole transfer material and the electron transfer material of the mixed layer and the difference between the electron affinity of an electron transfer material and the ionization potential of a hole transfer material are within the above range, the binding energy of excitons within the mixed layer may be greater than the binding energy of excitons of a hole transfer material or an electron transfer material. In other words, in the above range, the hole transfer material and the electron transfer material may smoothly form a charge transfer complex.

Specifically, the binding energy of excitons generated in the charge transfer complex of the mixed layer is smaller than the binding energy of excitons of a hole transfer material or an electron transfer material within the mixed layer. This is because, in the charge transfer complex, holes and electrons are farther away from each other than in the excitons generated in a single material. Therefore, the energy level difference range of the present specification can be an energy level difference so as to gain minimum energy to overcome the binding energy of excitons in order for the excitons generated in a hole transfer material and an electron transfer material within the mixed layer to be transferred to a charge transfer complex.

According to one embodiment of the present specification, the charge transfer complex may be generated by the direct recombination of holes within the hole transfer material and electrons within the electron transfer material. Specifically, when the above energy difference range of the hole transfer material and the electron transfer material is satisfied, the charge transfer complex can be smoothly formed by keeping holes within a hole transfer material and electrons within an electron transfer material within the mixed layer in a hole transfer material and an electron transfer material, respectively. In other words, when the above range is not satisfied, the formation of the charge transfer complex is no longer smooth, since the holes of the hole transfer material are transferred to an electron transfer material and the electrons of the electron transfer material are transferred to a hole transfer material within the mixed layer.

In the present specification, "HOMO" means the highest occupied molecular orbital, and "LUMO" means the lowest unoccupied molecular orbital.

In addition, "HOMO energy level difference" and "LUMO energy level difference" in the present specification mean the difference in the absolute value of each energy value. In addition, the HOMO and LUMO energy level are represented by an absolute value.

Furthermore, the exciton binding energy of the present specification means the magnitude of coulomb potential between electrons and charges within the molecule in an excited state.

The HOMO energy level can be measured using UV photoelectron spectroscopy (UPS), in which UV light is irradiated on the surface of a thin film and the ionization potential of the material is measured by detecting the ejected electrons. Also, the HOMO energy level can be measured using cyclic voltammetry (CV) in which, after the material to be measured is dissolved in a solvent with an electrolyte, the oxidation potential is measured using a voltage sweep. When the HOMO energy level of a thin-film shape is measured, a more accurate value can be obtained by using UPS than CV, and thus the HOMO energy level of the present specification is measured using the UPS method.

The LUMO energy level can be obtained through inverse photoelectron spectroscopy (IPES) or the measurement of electrochemical reduction potential. IPES is a method that determines a LUMO energy level by irradiating an electron beam on a thin film and measuring the light produced at that time. In addition, electrochemical reduction potential can be determined by measuring the reduction potential using a voltage sweep after the material to be measured has been dissolved in a solvent with an electrolyte. Also, the LUMO energy level can be calculated using a singlet energy level obtained by measuring the HOMO energy level and the degree of UV absorption of the object material.

According to one embodiment of the present specification, the hole transfer material of the mixed layer may include one or more types of substituents selected from the group consisting of an aromatic amine group; a ditolylamine group; an aromatic aniline group; an indolo acridine group; and an aromatic silane group.

According to one embodiment of the present specification, the aromatic amine group may be a carbazole group, a phenylamine group, a diphenylamine group and the like, but is not limited thereto.

According to one embodiment of the present specification, the hole transfer material of the mixed layer may include one or more types selected from the group consisting of NPB (4,4'-bis[N-(1-naphthyl)-N-phenyl-amino]-biphenyl) and PBP (4-phenylbenzophenone); m-MTDATA (4,4'4"-tris[3-methylphenyl(phenyl)amino]triphenylamine); and TCTA (4,4',4"-tri(N-carbazolyl)triphenylamine).

The LUMO energy level of the m-MTDATA is 2 eV, and the HOMO energy level is 5.1 eV. In addition, the LUMO energy level of TCTA is 2.1 eV, and the HOMO energy level is 5.5 eV.

Furthermore, according to one embodiment of the present specification, the hole transfer material of the mixed layer may include arylamine, aromatic amine, thiophene, carbazole, a fluorine derivative, N,N'-bis(naphthalen-1-yl)-N,N'-bis(phenyl)-benzidine, N,N'-bis(naphthalen-2-yl)-N,N'-bis(phenyl)-benzidine, N,N'-bis(3-methylphenyl)-N,N'-bis(phenyl)-benzidine, N,N'-bis(3-methylphenyl)-N,N'-bis(phenyl)-9,9-spirobifluorene, N,N'-bis(naphthalen-1-yl)-N,N'-bis(phenyl)-9,9-spirobifluorene, N,N'-bis(3-methylphenyl)-N,N'-bis(phenyl)-9,9-diphenyl-fluorene, N,N'-bis(naphthalen-1-yl)-N,N'-bis(phenyl)-9,9-dimethyl-fluorene, N,N'-bis(naphthalen-1-yl)-N,N'-bis(phenyl)-9,9-diphenyl-fluorene, 2,2',7,7'-tetrakis(N,N-diphenylamino)-9,9-spirobifluorene, 9,9-bis[4-(N,N-bis-naphthalen-2-yl-amino)phenyl]-9H-fluorene, 9,9-bis[4-(N-naphthalen-1-yl-N-phenylamino)-phenyl]-9H-fluorene, N,N'-bis(phenanthren-9-yl)-N,N'-bis(phenyl)-benzidine, 2,2'-bis(N,N-di-phenyl-amino)-9,9-spirobifluorene, di-[4-(N,N-ditolyl-amino)-phenyl]cyclohexane, 2,2',7,7'-tetra(N,N-ditolyl)amino-9,9-spiro-bifluorene, N,N,N',N'-tetra-naphthalen-2-yl-benzidine, N,N,N',N'-tetra-(3-methylphenyl)-3,3'-dimethylbenzidine, N,N'-di(naphthalen-2-yl)-N,N'-diphenylbenzene-1,4-diamine, N1,N4-diphenyl-N1,N4-dim-tolylbenzene-1,4-diamine, tris(4-(quinolin-8-yl)phenyl)amine, 2,2'-bis(3-(N,N-di-p-tolylamino)phenyl)biphenyl, N,N,N',N'-tetrakis(4-methoxyphenyl)benzidine, N,N'-diphenyl-N,N'-di-[4-(N,N-ditolyl-amino)phenyl]benzidine), and the like. However, the hole transfer material is not limited to the above hole transfer materials, and materials having strong electron-donating properties can be used as the hole transfer material.

According to one embodiment of the present specification, the electron transfer material of the mixed layer may include one or more types of substituents selected from the group consisting of a pyridine group; a triazine group; a phosphine oxide group; a benzofuran group; a dibenzofuran group; a benzothiophene group; a dibenzothiophene group; a benzophenone group; and an oxadiazole group.

According to one embodiment of the present specification, the electron transfer material of the mixed layer may include one or more types selected from the group consisting of PBP (4-phenylbenzophenone); t-Bu-PBD (2-(biphenyl-4-yl)-5-(4-tert-butylphenyl)-1,3,4-oxadiazole); 3TPYMB (tris-[3-(3-pyridyl)mesityl]borane); and B3PYMPM (bis-4,6-(3,5-di-3-pyridylphenyl)-2-methylpyrimi-dine).

The LUMO energy level of t-Bu-PBD is 2.4 eV, and the HOMO energy level is 6.1 eV. In addition, the LUMO energy level of B3PYMPB is 3.2 eV, and the HOMO energy level is 6.8 eV.

Furthermore, according to one embodiment of the present specification, the electron transfer material of the mixed layer may include 2,2',2"-(1,3,5-benzinetriyl)-tris(1-phenyl-1H-benzimidazole), 2-(4-biphenyl)-5-(4-tert-butylphenyl)-1,3,4-oxadiazole, 2,9-dimethyl-4,7-diphenyl-1,10-phenanthroline, 4,7-diphenyl-1,10-phenanthroline, bis(2-methyl-8-quinolinolate)-4-(phenylphenolato)aluminium, 1,3-bis[2-(2,2'-bipyridine-6-yl)-1,3,4-oxadiazo-5-yl]benzene), 6,6'-bis[5-(biphenyl-4-yl)-1,3,4-oxadiazo-2-yl]-2,2'-bipyridyl, 3-(4-biphenyl)-4-phenyl-5-tert-butylphenyl-1,2,4-triazole, 4-(naphthalen-1-yl)-3,5-diphenyl-4H-1,2,4-triazole, 2,9-bis(naphthalen-2-yl)-4,7-diphenyl-1,10-phenanthroline, 1,3-bis[2-(4-tert-butylphenyl)-1,3,4-oxadiazo-5-yl]benzene, tris(2,4,6-trimethyl-3-(pyridin-3-yl)phenyl)borane, 1-methyl-2-(4-(naphthalen-2-yl)phenyl)-1Himidazo[4,5f][1,10] phenanthroline, phenyl-dipyrenylphosphine oxide, 3,3',5,5'-tetra[(m-pyridyl)-phen-3-yl]biphenyl, 1,3,5-tri[(3-pyridyl)-phen-3-yl]benzene, 4,4'-bis(4,6-diphenyl-1,3,5-triazin-2-yl)biphenyl, 1,3-bis[3,5-di(pyridin-3-yl)phenyl]benzene, diphenylbis(4-(pyridin-3-yl)phenyl)silane, and the like. However, the electron transfer material is not limited to the above electron transfer materials, and materials having high electron affinities and strong electron-accepting properties can be used as the electron transfer material.

According to one embodiment of the present specification, the mixed layer may include one or more types selected from the group consisting of a charge transfer complex of NPB (4,4'-bis[N-(1-naphthyl)-N-phenyl-amino]-biphenyl) and PBP (4-phenylbenzophenone); a charge transfer complex of m-MTDATA (4,4'4"-tris[3-methylphenyl(phenyl)amino]triphenylamine) and t-Bu-PBD (2-(biphenyl-4-yl)-5-(4-tert-butylphenyl)-1,3,4-oxadiazole); a charge transfer complex of m-MTDATA (4,4'4"-tris[3-methylphenyl(phenyl)amino]triphenylamine) and 3TPYMB (tris-[3-(3-pyridyl)mesityl]borane); and a charge transfer complex of TCTA (4,4',4"-tri(N-carbazolyl)triphenylamine) and B3PYMPM (bis-4,6-(3,5-di-3-pyridylphenyl)-2-methylpyrimi-dine).

Specifically, the above charge transfer complexes may maximize the beneficial effects of the mixed layer described above.

According to one embodiment of the present specification, the driving voltage of an organic light emitting device that includes the mixed layer is not higher than the driving voltage of an organic light emitting device that does not include the mixed layer, and represents a low driving voltage. Therefore, the organic light emitting device of the present specification can have excellent efficiency.

According to one embodiment of the present specification, the quantum efficiency of an organic light emitting device that includes the mixed layer can be improved by 10% or more compared to the quantum efficiency of an organic light emitting device that does not include the mixed layer.

According to one embodiment of the present specification, the light emission efficiency (lm/W) of an organic light emitting device that includes the mixed layer can be improved by 20% or more compared to the light emission efficiency (lm/W) of an organic light emitting device that does not include the mixed layer.

According to one embodiment of the present specification, in an organic light emitting device that includes the mixed layer, more favorable quantum efficiency can be obtained due to the small donation of delayed fluorescence (DF).

According to one embodiment of the present specification, an organic light emitting device that includes the mixed layer can have improved quantum efficiency in a fluorescent or phosphorescent light emitting device. Specifically, an organic light emitting device that includes the mixed layer can have improved quantum efficiency in a fluorescent device. More specifically, the fluorescent device may be a fluorescent blue device.

According to one embodiment of the present specification, the thickness of the mixed layer may be greater than or equal to 1 nm and less than or equal to 200 nm. Specifically, the thickness of the mixed layer may be greater than or equal to 1 nm and less than or equal to 20 nm, or greater than or equal to 1 nm and less than or equal to 10 nm.

When the mixed layer of the present specification is formed within the above thickness range, the mixed layer can readily reuse triplet excitons of a light emitting layer. In other words, when the mixed layer of the present specification is formed within the above thickness range, the efficiency of the organic light emitting device is improved.

According to one embodiment of the present specification, the organic light emitting device may further include one or more selected from the group consisting of a hole injection layer; a hole blocking layer; a charge generation layer; an electron blocking layer; a charge generation layer; and an electron injection layer.

The charge generating layer refers to a layer in which holes and electrons are generated when voltage is applied.

In the present specification, a charge means an electron or a hole.

In the present specification, quantum efficiency is defined as the ratio of the number of charges injected to the number of photons that emit light.

According to one embodiment of the present specification, the first electrode may be an anode, and the second electrode may be a cathode.

In addition, according to one embodiment of the present specification, the first electrode may be a cathode, and the second electrode may be an anode.

Generally, in an organic light emitting device, electrons are injected and transferred from a cathode to a light emitting layer, and holes are injected and transferred from an anode to a light emitting layer.

Light emission properties are one of the most important properties of an organic light emitting device. It is important to have a charge balance in the light emitting area in order to efficiently achieve light emission in an organic light emitting device. For this, electrons transferred from a cathode and holes transferred from an anode need to be in balance quantitatively, and additionally, the place where excitons are formed by the meeting of the electrons and the holes needs to be within the light emitting area.

According to one embodiment of the present specification, an organic light emitting device that includes the mixed layer may improve a charge balance.

Hereinafter, each layer that constitutes the organic light emitting device according to one embodiment of the present specification will be described in detail. The material of each layer described below may be a single material or a mixture of two or more materials.

Anode

The anode includes a metal, a metal oxide or a conductive polymer. The conductive polymer may include an electro conductive polymer. For example, the anode may have a work function ranging from approximately 3.5 to 5.5 eV. Illustrative examples of the conductive material include carbon, aluminum, vanadium, chrome, copper, zinc, silver, gold, other metals and alloys thereof; zinc oxides, indium oxides, tin oxides, indium tin oxides (ITO), indium zinc oxide and other analogous metal oxides; and mixtures of oxides and metals such as $ZnO:Al$ and $SnO_2:Sb$. Both transparent materials and nontransparent materials can be used as anode materials. For structures in which light is emitted toward an anode, the anode may be formed so as to be transparent. Herein, being transparent means the degree to which light emitted from an organic material layer can be transmitted, and the transmittance of light is not particularly limited.

For example, when the organic light emitting device according to the present specification is a top emitting type, and the anode is formed on a substrate prior to the formation of an organic material layer and a cathode, not only transparent materials but also nontransparent materials having excellent light reflectivity may be used as anode materials. In another example, when the organic light emitting device according to the present specification is a bottom emitting type, and the anode is formed on a substrate prior to the formation of an organic material layer and a cathode, transparent materials need to be used as anode materials, or nontransparent materials need to be formed in a film that is sufficiently thin so as to be transparent.

Light Emitting Layer (EML)

In the light emitting layer, hole transfer and electron transfer occur simultaneously, therefore, the light emitting layer may have both n-type properties and p-type properties. For convenience's sake, it can be defined as an n-type light emitting layer when electron transfer is faster than hole transfer, and as a p-type light emitting layer when hole transfer is faster than electron transfer.

The n-type light emitting layer includes aluminum tris(8-hydroxyquinoline) ($Alq_3$); 8-hydroxyquinoline beryllium (BAlq); a benzoxazole-based compound, a benzthiazole-based compound or a benzimidazole-based compound; a polyfluorene-based compound; a silole-based compound, or the like, but is not limited thereto.

The p-type light emitting layer includes a carbazole-based compound; an anthracene-based compound; a polyphenylenevinylene polymer (PPV)-based polymer; a spiro compound, or the like, but is not limited thereto.

Cathode

Generally, materials having a small work function are preferable as a cathode material so that electron injection can be readily performed.

For example, in the present specification, materials having a work function ranging from 2 eV to 5 eV may be used as a cathode material. The cathode may include metals such as magnesium, calcium, sodium, potassium, titanium, indium, yttrium, lithium, gadolinium, aluminum, silver, tin and lead, or alloys thereof; materials having a multilayer structure such as LiF/Al or $LiO_2$/Al, or the like, but is not limited thereto.

The cathode may be formed using the same material as the anode. In this case, the cathode may be formed using the materials illustrated above as the anode materials. In addition, the cathode or the anode may include transparent materials.

According to one embodiment of the present specification, the organic light emitting device may include a light extraction layer. Specifically, according to one embodiment of the present specification, the light extraction layer may be an inside light extraction layer or an outside light extraction layer.

In addition, according to one embodiment of the present specification, the organic light emitting device may further include a substrate. Specifically, in the organic light emitting device, the first electrode or the second electrode may be provided on the substrate.

According to one embodiment of the present specification, the organic light emitting device may further include a substrate on an opposite surface on which the organic material layer of the first electrode is provided, and may further include an inside light extraction layer between the first electrode and the substrate provided on the opposite surface on which the organic material layer of the first electrode is provided.

According to one embodiment of the present specification, the inside light extraction layer may include a flattening layer.

In addition, according to one embodiment of the present specification, the organic light emitting device may further include a substrate on an opposite surface on which the organic material layer of the first electrode is provided, and may further include an outside light extraction layer on an opposite surface on which the first electrode of the substrate is provided.

According to one embodiment of the present specification, the outside light extraction layer may include a flattening layer.

According to one embodiment of the present specification, the inside light extraction layer or the outside light extraction layer induces light scattering, and the structure thereof is not particularly limited as long as it is a structure that can improve the light extraction efficiency of the organic light emitting device. Specifically, according to one embodiment of the present specification, the light extraction layer may have a structure in which scattering particles are dispersed within a binder.

According to one embodiment of the present specification, the light extraction layer may be directly formed on the substrate using a method such as spin coating, bar coating and slit coating, or may be formed using a method in which the light extraction layer is prepared in the form of a film and is attached.

According to one embodiment of the present specification, the organic light emitting device may be a flexible organic light emitting device. In this case, the substrate may include a flexible material. Specifically, the substrate may be a thin-film type glass that can be bent, a plastic substrate or a film-type substrate.

According to one embodiment of the present specification, the method for preparing the flexible organic light emitting device may include 1) a step of forming a polyimide layer on a carrier substrate, 2) a step of forming a thin glass substrate on the polyimide layer, 3) a step of forming an organic light emitting device on the thin glass substrate, and 4) a step of separating the carrier substrate.

According to one embodiment of the present specification, Step 1) is a step in which a polyimide layer is formed on a carrier substrate. As the carrier substrate, materials known in the related art may be used. More specifically, a glass substrate, a metal substrate, a plastic substrate, or the like, may be used as the carrier substrate; however, the carrier substrate is not limited thereto.

The thickness of the carrier substrate may be in the range of 0.5 mm to 0.7 mm, however, the thickness is not limited to this range.

The polyimide layer may be formed using methods known in the related art. More specifically, the polyimide layer may be formed using a process in which a polyimide film is layered on a carrier substrate, or may be formed by coating and curing a polyamic acid composition on a carrier substrate.

According to one embodiment of the present specification, a roll-to-roll process as well as a plate-to-plate process or a roll-to-plate process may be used as the process in which a polyimide layer, a thin glass substrate and an organic light emitting device are formed in consecutive order on the carrier substrate. In particular, according to one embodiment of the present specification, there are advantages such that the process reduces costs since a flexible organic light emitting device can be prepared using a roll-to-roll process.

According to one embodiment of the present specification, the Step 4) may be a step of separating the carrier substrate. In this case, as the method of separating the carrier substrate, methods known in the related art, such as those employing a knife or laser, may be used, and particularly, the carrier substrate can be readily separated just by using a knife.

The material of the plastic substrate is not particularly limited, however, generally, films such as PET, PEN, PEEK and PI may be included in a monolayer or multilayer form.

The present specification provides a display device that includes the organic light emitting device. The organic light emitting device plays the role of a pixel or a backlight in the display device. As other components required in the display device in addition to this, those known in the related art may be applied.

The present specification provides an illumination device that includes the organic light emitting device. The organic light emitting device plays the role of a light emitting unit in the illumination device. As other components required in the illumination device in addition to this, those known in the related art may be applied.

Hereinafter, the present specification will be described in detail with reference to an example in order to specifically describe the present specification. It is to be understood, however, that the example according to the present specification can be modified into various other forms, and the example described below is not intended to limit the scope of the present specification. The example of the present specification is provided in order to more completely describe the present specification to those having average knowledge in the related art.

Example

An organic light emitting device was prepared by laminating a hole injection layer having a thickness of 30 nm, a first hole transfer layer having a thickness of 45 nm, a second hole transfer layer having a thickness of 15 nm, a fluorescent blue light emitting layer having a thickness of 30 nm, a mixed layer having a thickness of 20 nm and aluminum in consecutive order on ITO. Data on the quantum efficiency, the light emission efficiency and the driving voltage of the organic light emitting device according to the above example are shown in FIG. 5.

Comparative Example

The organic light emitting device was prepared in the same manner as in the above example except that an electron transfer layer was formed instead of the mixed layer of Example 1. Data on the quantum efficiency, the light emission efficiency and the driving voltage of the organic light emitting device according to the above comparative example are shown in FIG. 5.

Figure 5:
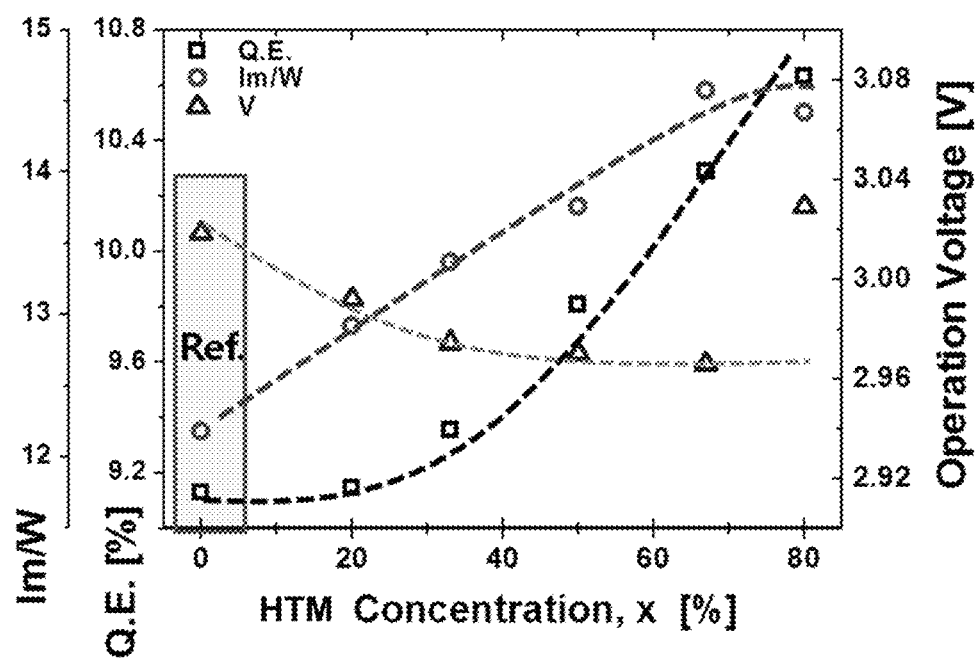
FIG. 5 shows the result of driving voltage, light emission efficiency and quantum efficiency of an organic light emitting device according to an example and a comparative example.

FIG. 5 compares the quantum efficiency, the light emission efficiency and the driving voltage of the organic light emitting device (x=0; comparative example) that includes the electron transfer layer having an electron transfer material (ETM) only, with the organic light emitting device (x>0; example) in which the mixed layer, which includes the hole transfer material and the electron transfer material of one embodiment of the present specification, is provided.

The x axis of FIG. 5 shows the relative amount of the hole transfer material in the entire mixed layer as a percentage.

As shown in the data of FIG. 5, when the mixed layer of the present specification was provided instead of the electron transfer layer, it can be seen that the quantum efficiency and the light emission efficiency were excellent, and the driving voltage was low.

REFERENCES

101: Anode
201: Hole Transfer Layer
301: Mixed Layer
401: Light emitting layer
501: Electron Transfer Layer
601: Cathode

The invention claimed is:

1. An organic light emitting device comprising:
a first electrode;
a second electrode; and
two or more organic material layers provided between the first electrode and the second electrode,
wherein the first electrode is either an anode or a cathode and wherein when the first electrode is the anode, the second electrode is the cathode,
wherein the organic material layer includes a light emitting layer; and
a mixed layer including one or more hole transfer materials and one or more electron transfer materials,
wherein the mixed layer is provided between the light emitting layer and the cathode, and the mixed layer is in direct contact with the cathode
wherein the mixed layer includes a charge transfer complex of the hole transfer material and the electron transfer material,
wherein the hole transfer material of the mixed layer includes one or more types selected from the group consisting of NPB (4,4'-bis[N-(1-naphthyl)-N-phenyl-amino]-biphenyl) and PBP (4-phenylbenzophenone); m-MTDATA (4,4'4"-tris[3-methylphenyl(phenyl)amino]triphenyl amine); and TCTA (4,4',4"-tri(N-carbazolyl)triphenylamine), and
wherein the electron transfer material of the mixed layer includes one or more types selected from the group consisting of PBP (4-phenylbenzophenone); t-Bu-PBD (2-(biphenyl-4-yl)-5-(4-tert-butylphenyl)-1,3,4-oxadiazole); 3TPYMB (tris-[3-(3-pyridyl)mesityl]borane); and B3PYMPM (bis-4,6-(3,5-di-3-pyridylphenyl)-2-methylpyrimi-dine).

2. The organic light emitting device of claim 1, wherein the mixed layer is adjoined to the light emitting layer.

3. The organic light emitting device of claim 1, wherein a mass ratio of the hole transfer material and the electron transfer material of the mixed layer ranges from 1:4 to 4:1.

4. The organic light emitting device of claim 1, wherein a HOMO energy level difference between the hole transfer material and the electron transfer material of the mixed layer is 0.2 eV or more.

5. The organic light emitting device of claim 1, wherein a LUMO energy level difference between the hole transfer material and the electron transfer material of the mixed layer is 0.2 eV or more.

6. The organic light emitting device of claim 1, wherein a difference between the LUMO energy level of the electron transfer material and the HOMO energy level of the hole transfer material of the mixed layer is 2 eV or more.

7. The organic light emitting device of claim 1, wherein an ionization potential difference between the hole transfer material and the electron transfer material of the mixed layer is 0.2 eV or more.

8. The organic light emitting device of claim 1, wherein an electron affinity difference between the hole transfer material and the electron transfer material of the mixed layer is 0.2 eV or more.

9. The organic light emitting device of claim 1, wherein a difference between an electron affinity of the electron transfer material and an ionization potential of the hole transfer material of the mixed layer is 2 eV or more.

10. The organic light emitting device of claim 1, wherein the mixed layer includes one or more types selected from the group consisting of a charge transfer complex of NPB (4,4'-bis[N-(1-naphthyl)-N-phenyl-amino]-biphenyl) and PBP (4-phenylbenzophenone); a charge transfer complex of m-MTDATA (4,4'4"-tris[3-methylphenyl(phenyl)amino]triphenyl amine) and t-Bu-PBD (2-(biphenyl-4-yl)-5-(4-tert-butylphenyl)-1,3,4-oxadiazole); a charge transfer complex of m-MTDATA (4,4'4"-tris[3-methylphenyl(phenyl)amino] triphenylamine) and 3TPYMB (tris-[3-(3-pyridyl)mesityl] borane); and a charge transfer complex of TCTA (4,4',4"-tri(N-carbazolyl)triphenylamine) and B3PYMPM (bis-4,6-(3,5-di-3-pyridylphenyl)-2-methyl pyrimi-dine).

11. The organic light emitting device of claim 1, wherein a thickness of the mixed layer is greater than or equal to 1 nm and less than or equal to 200 nm.

12. The organic light emitting device of claim 1, further comprising:
one or more selected from the group consisting of a hole injection layer; a hole blocking layer; a charge generation layer; an electron blocking layer; a charge generation layer; and an electron injection layer.

13. The organic light emitting device of claim 1, further comprising:
a substrate provided on an opposite surface on which the organic material layer of the first electrode is provided; and
an inside light extraction layer provided between the substrate and the first electrode.

14. The organic light emitting device of claim 13, wherein the inside light extraction layer includes a flattening layer.

15. The organic light emitting device of claim 1, further comprising:
a substrate provided on an opposite surface on which the organic material layer of the first electrode is provided; and
an outside light extraction layer on an opposite surface on which the first electrode of the substrate is provided.

16. The organic light emitting device of claim 15, wherein the outside light extraction layer includes a flattening layer.

17. The organic light emitting device of claim 1, wherein the organic light emitting device is a flexible organic light emitting device.

18. A display device including the organic light emitting device of claim 1.

19. An illumination device including the organic light emitting device of claim 1.

* * * * *